(12) United States Patent
Booth, Jr. et al.

(10) Patent No.: US 7,977,766 B2
(45) Date of Patent: Jul. 12, 2011

(54) TRENCH ANTI-FUSE STRUCTURES FOR A PROGRAMMABLE INTEGRATED CIRCUIT

(75) Inventors: Roger A. Booth, Jr., Wappingers Falls, NY (US); Kangguo Cheng, Guilderland, NY (US); Jack A. Mandelman, Flat Rock, NC (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 12/537,473

(22) Filed: Aug. 7, 2009

(65) Prior Publication Data

US 2010/0230781 A1 Sep. 16, 2010

Related U.S. Application Data

(60) Provisional application No. 61/158,768, filed on Mar. 10, 2009.

(51) Int. Cl.
*H01L 21/00* (2006.01)
*H01L 23/535* (2006.01)
(52) U.S. Cl. ........... 257/530; 438/131; 257/E21.585; 257/E23.147; 257/E21.591
(58) Field of Classification Search .......... 257/530, 257/E21.591, E23.147, E21.585; 438/131, 438/467, 600
See application file for complete search history.

(56) References Cited

U.S. PATENT DOCUMENTS

| | | | | | |
|---|---|---|---|---|---|
| 5,331,196 | A | * | 7/1994 | Lowrey et al. | 257/529 |
| 5,451,810 | A | * | 9/1995 | Tigelaar et al. | 257/530 |
| 5,502,000 | A | | 3/1996 | Look et al. | |
| 5,866,937 | A | * | 2/1999 | McCollum | 257/530 |
| 5,915,171 | A | | 6/1999 | Sheu | |
| 6,096,580 | A | | 8/2000 | Iyer et al. | |
| 6,130,469 | A | | 10/2000 | Bracchitta et al. | |
| 6,388,305 | B1 | | 5/2002 | Bertin et al. | |
| 6,509,624 | B1 | | 1/2003 | Radens et al. | |
| 6,740,957 | B2 | | 5/2004 | Porter | |
| 6,768,185 | B2 | | 7/2004 | Cleeves et al. | |
| 6,812,122 | B2 | * | 11/2004 | Bertin et al. | 438/600 |
| 6,858,916 | B2 | * | 2/2005 | Sakoh | 257/530 |
| 7,087,499 | B2 | | 8/2006 | Rankin et al. | |
| 7,256,471 | B2 | * | 8/2007 | Min et al. | 257/530 |

* cited by examiner

*Primary Examiner* — Evan Pert
(74) *Attorney, Agent, or Firm* — Wood, Herron & Evans LLP

(57) ABSTRACT

Trench anti-fuse structures, design structures embodied in a machine readable medium for designing, manufacturing, or testing a programmable integrated circuit. The anti-fuse structure includes a trench having a plurality of sidewalls that extend into a substrate, a doped region in the semiconductor material of the substrate proximate to the sidewalls of the trench, a conductive plug in the trench, and a dielectric layer on the sidewalls of the trench. The dielectric layer is disposed between the conductive plug and the doped region. The dielectric layer is configured so that a programming voltage applied between the doped region and the conductive plug causes a breakdown of the dielectric layer within a region of the trench. The trench sidewalls are arranged with a cross-sectional geometrical shape that is independent of position between a bottom wall of the deep trench and a top surface of the substrate.

21 Claims, 16 Drawing Sheets

TRENCH ANTI-FUSE STRUCTURES FOR A PROGRAMMABLE INTEGRATED CIRCUIT

Applicant claims the benefit of Provisional Application Ser. No. 61/158,768, Trench Anti-Fuse Structures for a Programmable Integrated Circuit, filed on Mar. 10, 2009.

BACKGROUND

The invention relates generally to semiconductor device fabrication and, in particular, to device structures for a trench anti-fuse, and to design structures for programmable integrated circuits.

Anti-fuses are nonvolatile, one-time programmable devices widely used in various programmable integrated circuits. An anti-fuse structure, which comprises a pair of conducting terminals separated by a dielectric layer, is connected to an integrated circuit and is initially non-conductive at the time of fabrication. When it is desired to change the operational configuration of the integrated circuit, an anti-fuse may be irreversibly programmed to create a permanent conductive link that closes a previously open, high resistance circuit path. One common use of anti-fuses is in redundancy circuits of dynamic random access memories and static random access memories. Replacing a defective circuit element typically entails blowing an anti-fuse to program a redundant circuit element to respond to the address of the defective primary circuit element in the memory device. Another common use of anti-fuses is in programmable read-only memories and programmable logic devices (PLDs) to program logic circuits to create a customized design. Yet another common use of anti-fuses is to program the I/O configuration of a memory device.

Specifically, application of a stimulus, such as suitable electrical current passed through the dielectric layer by application of a predetermined voltage to the pair of terminals, operates to break down the dielectric layer and thereby to significantly reduce the electrical resistance of the dielectric layer. The reduced electrical resistance of the dielectric layer creates a closed conductive link or short between the terminals. Once programmed to provide the low-resistance, closed state, the anti-fuse cannot be programmed back to a high-resistance, open state. Programming voltages for planar anti-fuse structures are significantly greater than five volts, which makes existing anti-fuse structures incompatible with advanced integrated circuit designs.

Fabricating anti-fuses in trenches increases the device density in comparison with conventional planar anti-fuse device structures. However, when blown, trench anti-fuses may often exhibit poor breakdown uniformity because the trenches are characterized by different cross-sectional geometrical shapes at different trench depths. The non-uniformity in cross-sectional shape with depth arises from the crystallographic orientation dependence of trench etch processes like reactive ion etching. For example, a shallow portion of a trench may exhibit a substantially octagonal cross-sectional geometrical shape and a deeper portion of the same trench may exhibit a substantially rectangular cross-sectional geometrical shape. The thickness of silicon oxide grown on the trench sidewalls also exhibits a dependence upon crystallographic plane. For example, silicon oxide grows thicker on (110) crystal planes of silicon than on (100) crystal planes. Silicon oxide also grows significantly thinner at trench corners than on the trench planes between adjacent corners. Furthermore, it is very difficult, if not impossible, to control the curvature of trench corners formed by reactive ion etching processes.

The uniformity of programming operation of a trench anti-fuse is primarily determined by the oxide thickness and the electric field at the trench corners. The electric field is determined primarily by the curvature of the trench corners. During the operation programming a trench anti-fuse, only the thin oxide at trench corners in the deeper portion of the trench typically breaks down to provide the low-resistance, closed state connecting the terminals. The non-uniformity in trench shapes and corner curvatures leads to undesired large variation in the characteristics of trench anti-fuse structures. This adversely affects the performance and predictability of the anti-fuse structure. Furthermore, conventional trench anti-fuses still require a programming voltage significantly in excess of five volts to accommodate the large observed variation in anti-fuse characteristics.

Improved device structures and design structures are needed for anti-fuses that alleviate these and other problems associated with conventional anti-fuse device structures and design structures.

BRIEF SUMMARY

In one embodiment of the invention, an anti-fuse structure includes a trench with a bottom wall and a plurality of sidewalls that extend from a top surface of a substrate to the bottom wall. The anti-fuse structure includes a doped region in the semiconductor material of the substrate proximate to the sidewalls of the trench, a conductive plug in the trench, and a dielectric layer on the sidewalls of the trench. The dielectric layer is disposed between the conductive plug and the doped region. The dielectric layer is configured so that a programming voltage applied between the doped region and the conductive plug causes an irreversible breakdown of the dielectric layer within a region of the trench to electrically connect the doped region with the conductive plug. The sidewalls of the trench are arranged with a cross-sectional geometrical shape that is independent of position between the bottom wall of the trench and the top surface of the substrate.

In another embodiment of the invention, the anti-fuse structure is included in a design structure, which is embodied in a machine readable medium for designing, manufacturing, or testing an integrated circuit. The design structure may comprise a netlist. The design structure may also reside on storage medium as a data format used for the exchange of layout data of integrated circuits. The design structure may reside in a programmable gate array.

An aspect of the invention may comprise a design structure embodied in a machine readable medium for designing, manufacturing, or testing an integrated circuit, the design structure comprising:

a trench including a bottom wall and a plurality of sidewalls that extend from a top surface of a substrate to the bottom wall, the sidewalls of the trench arranged with a cross-sectional geometrical shape that is independent of position between the bottom wall of the trench and the top surface of the substrate;

a doped region in a semiconductor material of the substrate proximate to the sidewalls of the trench;

a conductive plug in the trench; and a dielectric layer on the sidewalls of the trench, the dielectric layer disposed between the conductive plug and the doped region, wherein the dielectric layer is configured so that a programming voltage applied between the doped region and the conductive plug causes an irreversible breakdown of the dielectric layer within a region of the trench to electrically connect the doped region irreversibly with the conductive plug.

In yet another embodiment of the invention, an anti-fuse structure includes a first shallow trench with a bottom wall and a plurality of sidewalls that extend from a top surface of a substrate to the bottom wall. The sidewalls of the first shallow trench are arranged with a first cross-sectional geometrical shape. A second shallow trench is provided in the substrate adjacent to the first shallow trench and is filled with a dielectric material. The second shallow trench has a plurality of sidewalls with a different cross-sectional geometrical shape than the first cross-sectional geometrical shape of the first shallow trench. The anti-fuse structure further includes a doped region in the semiconductor material of the substrate proximate to the sidewalls of the first shallow trench, a conductive plug in the first shallow trench, and a dielectric layer on the sidewalls of the first shallow trench. The dielectric layer is disposed between the conductive plug and the doped region. The dielectric layer is configured so that a programming voltage applied between the doped region and the conductive plug causes an irreversible breakdown of the dielectric layer within a region of the first shallow trench to electrically connect the doped region with the conductive plug.

In still another embodiment of the invention, a method for fabricating a programmable anti-fuse structure includes forming a trench in a substrate that has a plurality of sidewalls arranged with a first cross-sectional geometrical shape. The semiconductor material of the substrate proximate to the sidewalls of the trench is doped to define a first conductive terminal of the anti-fuse structure. The method further includes modifying the sidewalls of the trench to change the first cross-sectional geometrical shape to a second cross-sectional geometrical shape, and forming a dielectric layer of non-uniform thickness on the sidewalls of the trench. A conductive plug is formed in the trench to define a second conductive terminal of the anti-fuse structure that is separated from the first conductive terminal by the dielectric layer.

In still another embodiment of the invention, a method for fabricating a programmable anti-fuse structure includes defining a deep trench that has a bottom wall and a plurality of sidewalls extending from a top surface of a substrate to the bottom wall, forming a first terminal in the semiconductor material of the substrate bordering the deep trench, and forming a second terminal inside the deep trench. The method further includes forming a dielectric layer on the sidewalls of the deep trench that separates the second terminal from the first terminal. When a programming voltage is applied between the first and second terminals, the dielectric layer has an approximately equal probability of irreversible breakdown independent of location between the bottom wall of the deep trench and the top surface of the substrate.

In yet another embodiment of the invention, a method for fabricating a programmable anti-fuse structure includes defining a trench in a substrate that has a bottom wall, a plurality of sidewalls extending from a top surface of the substrate to the bottom wall, and a corner at an intersection between each adjacent pair of sidewalls. A first terminal is formed by doping the semiconductor material of the substrate bordering the trench. The method further includes exposing the sidewalls to a wet chemical etching solution under conditions effective to reduce an included angle of the concave corner between each adjacent pair of the sidewalls of the trench. A dielectric layer is formed on the sidewalls that is thinner proximate to each corner of reduced included angle than on the adjacent pair of the sidewalls. A conductive plug is formed inside the trench to define a second terminal that is separated from the first terminal by the dielectric layer.

In another embodiment of the invention, a method is provided for programming an anti-fuse structure formed in a trench having a plurality of sidewalls extending into a substrate. The anti-fuse structure includes a dielectric layer on the sidewalls, a first terminal in the semiconductor material of the substrate bordering the trench, and a second terminal inside the trench and separated from the first terminal by the dielectric layer. In response to applying a programming voltage between the first terminal and the second terminal, the dielectric layer is caused to irreversibly breakdown with an approximately equal probability along substantially an entire height of the trench and, thereby, to electrically couple the first terminal permanently with the second terminal.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
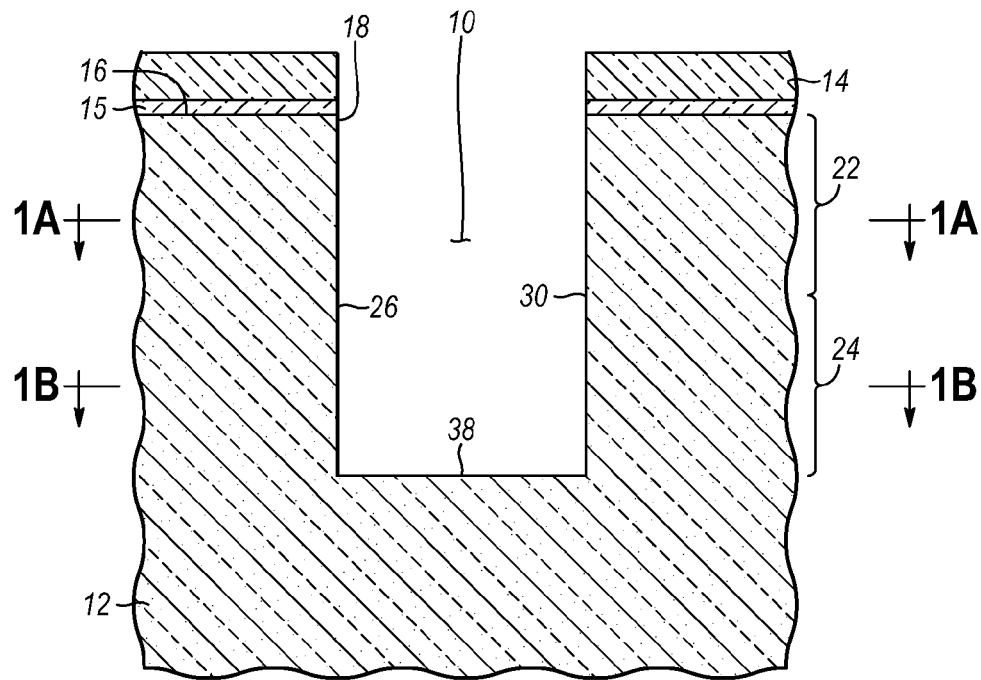
FIG. 1 is a diagrammatic cross-sectional view of a portion of a substrate at an initial fabrication stage of a processing method in accordance with an embodiment of the invention.
Figure 1A:
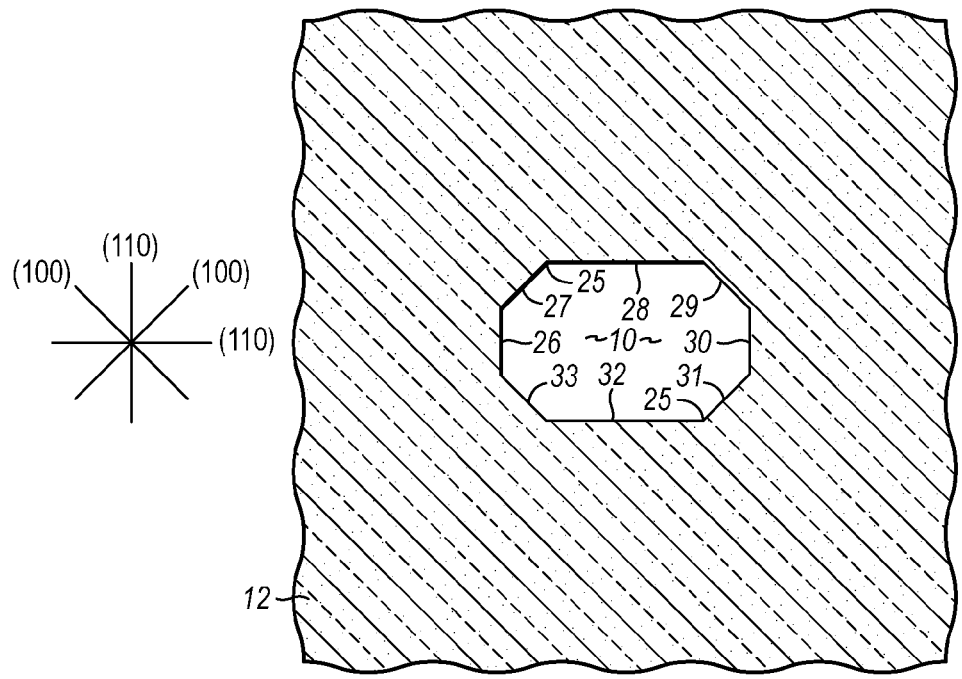
FIG. 1A is a diagrammatic cross-sectional view taken generally along line 1A-1A in FIG. 1.
Figure 1B:
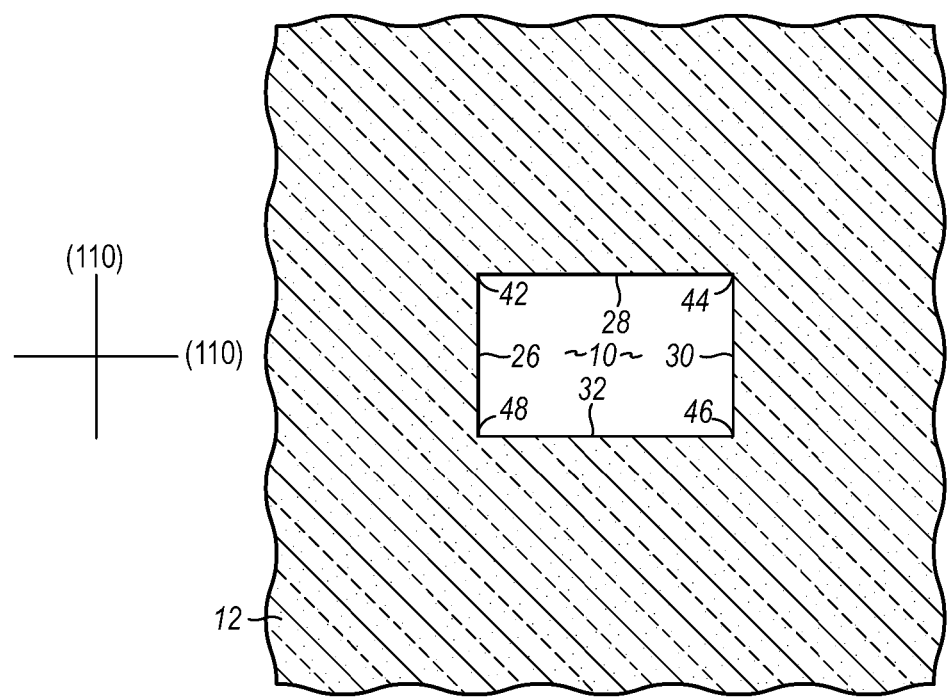
FIG. 1B is a diagrammatic cross-sectional view taken generally along line 1B-1B in FIG. 1.

With reference to FIGS. 1, 1A, 1B and in accordance with an embodiment of the invention, a deep trench 10 is formed in a substrate 12 by a conventional patterning and etch process. Substrate 12 may be any suitable bulk substrate containing a semiconductor material that a person having ordinary skill in the art would recognize as suitable for forming an integrated circuit with the proviso that the semiconductor material is capable of crystallographic etching, as explained below. In a representative embodiment, substrate 12 is composed of monocrystalline silicon with a nominal (100) surface normal. The semiconductor material constituting substrate 12 may be lightly doped with an n-type or p-type impurity.

A hardmask layer 14 and a comparatively thin pad layer 15 are applied to a top surface 16 of substrate 12. The hardmask layer 14, which is separated from the top surface 16 by the pad layer 15, is composed of a dielectric material, such as silicon dioxide ($SiO_2$), deposited by a conventional deposition process. The dielectric material constituting the hardmask layer 14 is chosen to etch selectively to the semiconductor material constituting the substrate 12. The pad layer 15 is often composed of $Si_3N_4$ deposited by a conventional deposition process and may further include an optional $SiO_2$ layer grown by oxiding the top surface 16 of substrate 12.

The hardmask layer 14 is coated with a resist layer (not shown) composed of a sacrificial organic material. The resist layer, which is applied by a conventional application technique, is patterned by a conventional photolithography and etch process. The photolithography process entails exposing the resist layer to radiation imaged using a photomask to impart a latent trench pattern and developing the latent pattern in the exposed resist to define residual areas of resist layer that mask portions of the hardmask layer 14. The trench pattern is transferred from the resist layer to the hardmask layer 14 and pad layer 15 by an anisotropic dry etch process, such as a reactive-ion etching (RIE) process. Masked portions of the hardmask layer 14 and pad layer 15 are unaffected by the dry etch process and unmasked portions of the hardmask layer 14 and pad layer 15 are removed by the dry etch process, which stops on the top surface 16 of substrate 12 to define openings, such as the representative opening 18. After the resist layer is removed by ashing or solvent stripping, the trench pattern is subsequently transferred from the hardmask layer 14 to the substrate 12 using another anisotropic dry etch process and the patterned hardmask layer 14 as a physical etch mask. Surface areas of the substrate 12 masked by the hardmask layer 14 remain intact. In places where the hardmask layer 14 is absent, the semiconductor material of the substrate 12 is removed to define deep trenches, such as the representative deep trench 10 that is registered with the opening 18.

As apparent from a comparison of FIG. 1A with FIG. 1B, the cross-sectional geometrical shape of the deep trench 10 varies as a function of depth relative to the top surface 16. At relatively shallow depths, the deep trench 10 has an upper section 22 of a first cross-sectional geometrical shape viewed normal to the top surface 16 and, at greater depths, the deep trench 10 has a lower section 24 characterized by a different cross-sectional geometrical shape or profile than the upper section 22. For example, the cross-sectional geometrical shapes of the upper and lower sections 22, 24 may have a different number of sidewalls. A transition between the different cross-sectional geometrical shapes occurs between the upper and lower sections 22, 24 along the height of the deep trench 10 that may be either gradual or abrupt.

The difference in the cross-sectional geometrical shapes arises from the dependence of the anisotropic dry etch process upon crystal orientation. The upper section 22 of the deep trench 10 is characterized by a plurality of sidewalls 26, 27, 28, 29, 30, 31, 32, 33 and the lower section 24 only includes sidewalls 26, 28, 30, 32. Adjacent pairs of sidewalls 26-33 in the upper section 22 intersect at concave corners 25, as shown in FIG. 1A, and adjacent pairs of sidewalls 26, 28, 30, 32 in the lower section 24 intersect at concave corners 42, 44, 46, 48. Hence, the included angle at the corner 25 between each adjacent pair of sidewalls 26-33 in the upper section 22 is larger than the included angle at the corners 42, 44, 46, 48.

In the representative embodiment, the substrate 12 is formed from single crystal silicon, which has a diamond lattice structure represented by two interpenetrating face-centered cubic lattice structures with identical atoms in each sublattice. Among the principle crystal planes of single crystal silicon, (100) crystal planes are recognized by a person having ordinary skill in the art to etch much faster than (110) crystal planes. In contrast, (111) crystal planes of single crystal silicon are recognized by a person having ordinary skill in the art to a significantly lower etch rate than either (110) or (100) crystal planes. If substrate 12 has a surface normal parallel to the [001] direction, crystallographically equivalent pairs of (100) and (110) crystal planes are arranged about, and centered on, the [001] surface normal with adjacent (100) and (110) crystal planes separated by an included angle of $\pi/4$ radians)(45°).

Because of the depth dependence of the anisotropic dry etch process upon crystal orientation, the sidewalls 26-33 in the upper section 22 of the deep trench 10 are arranged in an octagonal cross-sectional geometrical shape and the sidewalls 26, 28, 30, 32 in the lower section 24 are arranged in a rectangular cross-sectional geometrical shape. Corners 25 between adjacent pairs of the sidewalls 26-33 in the upper section 22 are characterized by an included angle of about 135°. For example, the included angle at corner 25 between sidewall 27 and sidewall 28 in FIG. 1A is about 135°. Corners 42, 44, 46, 48 between adjacent pairs of the sidewalls 26, 28, 30, 32 in the lower section 24 are characterized by an included angle of about 90°. For example, the included angle at corner 42 between sidewall 26 and sidewall 28 in FIG. 1B is about 90°.

Figure 2:
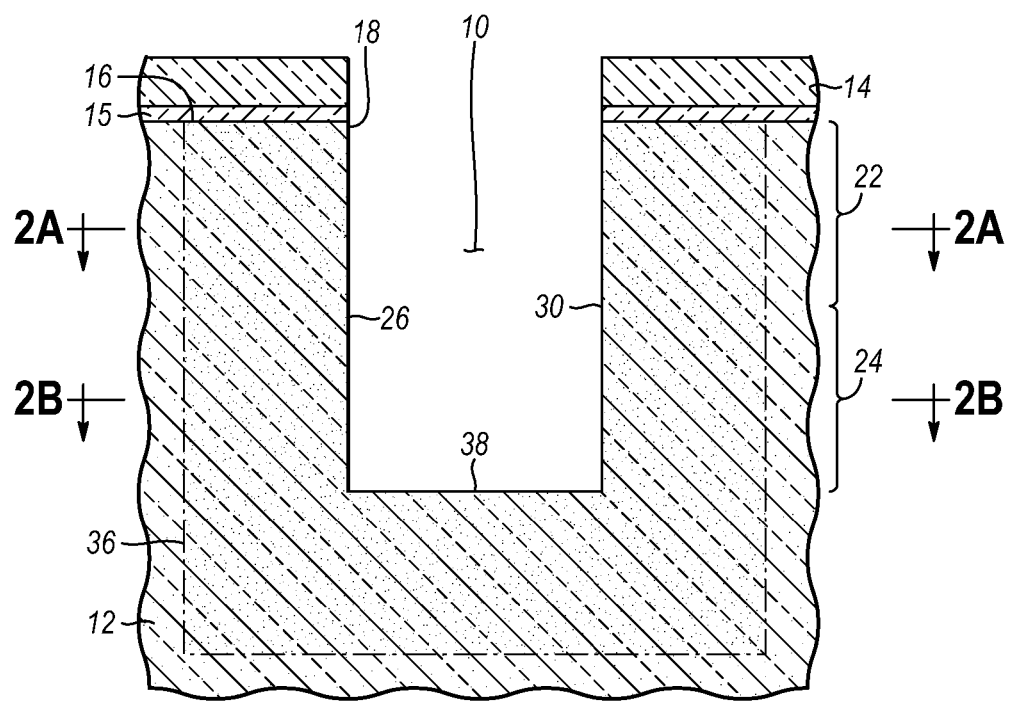
FIGS. 2, 2A, and 2B are diagrammatic cross-sectional views similar to FIGS. 1, 1A, and 1B taken at a subsequent fabrication stage of the processing method.
Figure 2A:
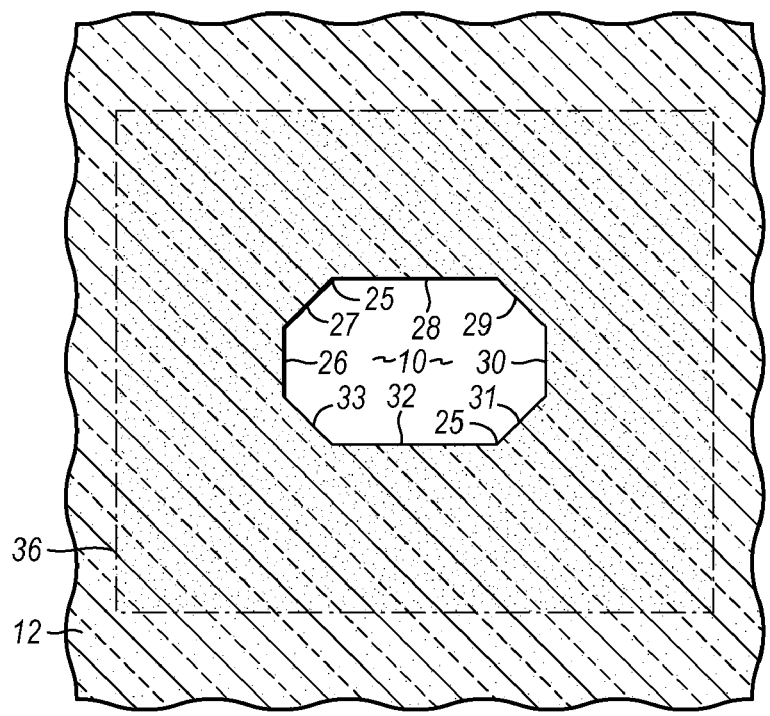
Figure 2B:
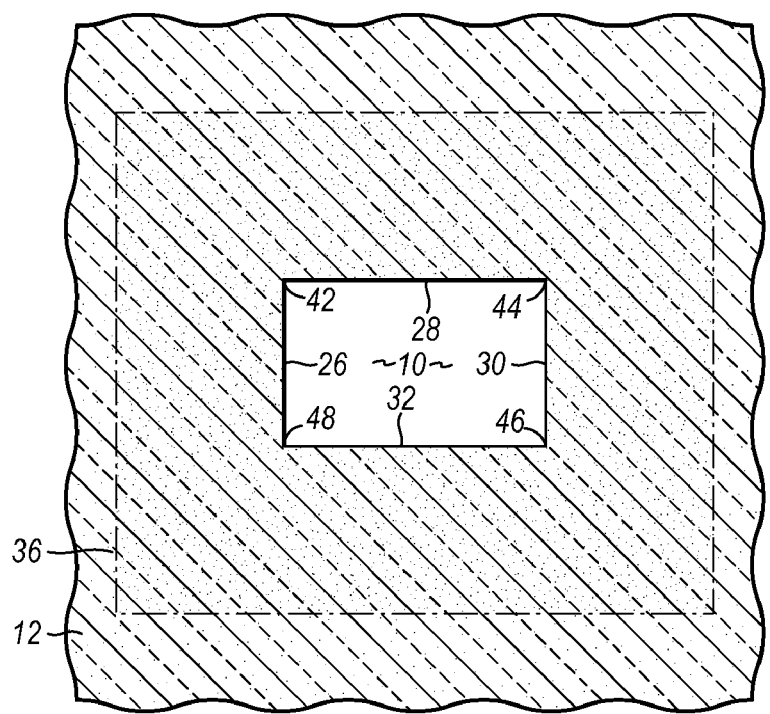

With reference to FIGS. 2, 2A, 2B in which like reference numerals refer to like features in FIGS. 1, 1A, 1B and at a subsequent fabrication stage, a terminal of the trench antifuse structure 65 (FIGS. 6, 6A, 6B) in the representative form of a buried plate 36 is provided in the semiconductor material of the substrate 12 near the deep trench 10. Specifically, the buried plate 36 circumscribes the deep trench 10 and extends from a depth greater than a bottom wall 38 of the deep trench 10 to the top surface 16 of the substrate 12. The buried plate 36 may be heavily doped with, for example, a concentration of an n-type dopant, like arsenic and/or phosphorus, or a concentration of a p-type dopant, such as boron and/or in indium.

Buried plate doping may be performed by a conventional process such as a high temperature solid phase doping process that out-diffuses a dopant from a sacrificial plug (not shown) of, for example, a doped silicate glass formed in deep trench 10. The sacrificial plug may be composed of an n-type doped glass, such as arsenic-doped silicate glass (ASG). Alternatively, the sacrificial plug may be composed of a p-type doped glass, such as a boron-doped silicate glass (BSG). After the dopant has penetrated a suitable distance into the constituent semiconductor material of substrate 12 to form the buried plate 36 containing a concentration of the dopant, the sacrificial plug may be removed by stripping using a wet etching solution, such as a solution of buffered hydrofluoric acid.

Other methods of introducing a dopant into the semiconductor material of the substrate 12 to form buried plate 36 include, but are not limited to, gas phase doping, plasma doping, ion implantation, liquid phase doping, infusion doping, or any combination of these processes, which are well known to a person having ordinary skill in the art. The semiconductor material of the substrate 12 may have the same conductivity type as the semiconductor material of the buried plate 36 or the opposite conductivity type of the semiconductor material of the buried plate 36. As understood by a person having ordinary skill in the art, multiple device structures may share the same buried plate 36.

Figure 3:
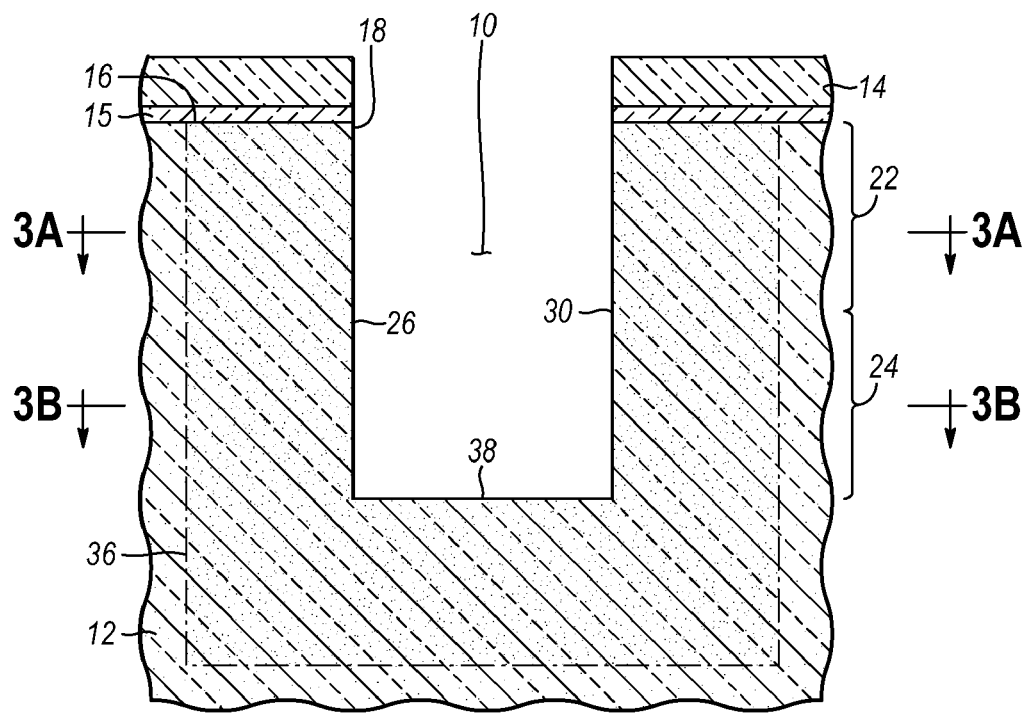
FIGS. 3, 3A, and 3B are diagrammatic cross-sectional views similar to FIGS. 2, 2A, and 2B at a subsequent fabrication stage of the processing method.
Figure 3A:
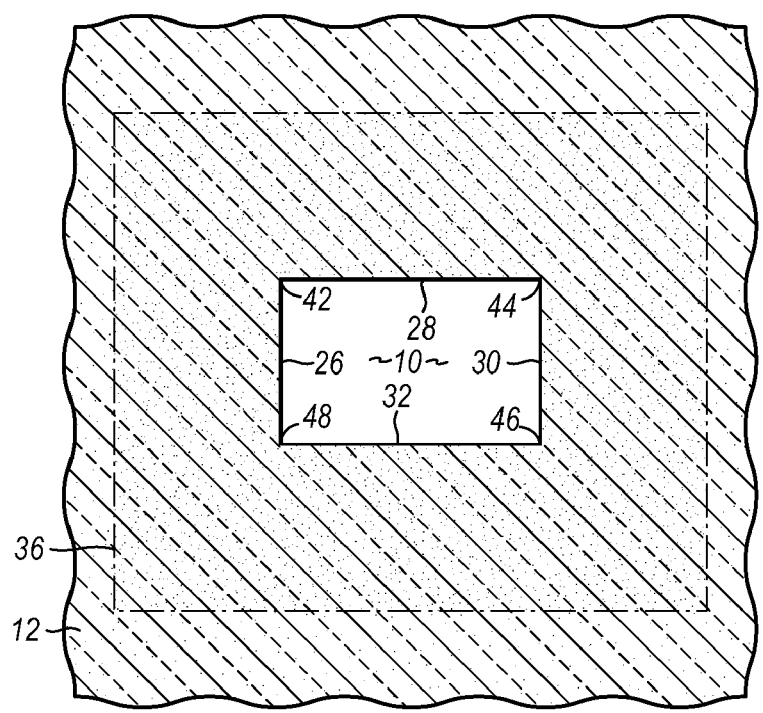
Figure 3B:
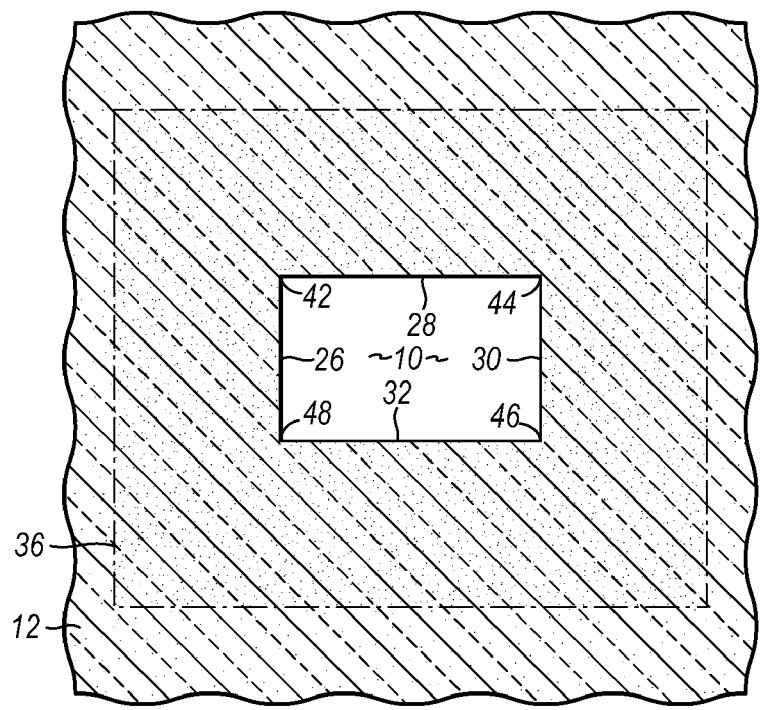

With reference to FIGS. 3, 3A, 3B in which like reference numerals refer to like features in FIGS. 2, 2A, 2B and at a subsequent fabrication stage, a crystallographic etching process is applied to sharpen the corners 25 between adjacent pairs of sidewalls 26-33 in the upper section 22. The crystallographic etching process also increases the cross-sectional area of the deep trench 10. The crystallographic etching process effectively eliminates the sidewalls 27, 29, 31, 33 and, thereby, corners 25 so that sidewalls 26, 28, 30, 32 and corners 42, 44, 46, 48 are continuous along the full height of the deep trench 10. As a result, the cross-sectional shape for the upper section 22 of the deep trench 10 changes to conform to the cross-sectional shape of the lower section 24 of the deep trench 10. As a result, the corners 42, 44, 46, 48 between adjacent pairs of sidewalls 26, 28, 30, 32 become uniform along the entire height of the deep trench 10 and, thus, have a consistent, uniform included angle at each of the corners 42, 44, 46, 48.

The crystallographic etching process used to modify the deep trench 10 may be any suitable dry and/or wet etching techniques known to a person having ordinary skill in the art. In one embodiment, the crystallographic etching of the deep trench 10 is accomplished by one or more wet chemical etching processes, which employ etching solutions including but not limited to ammonia ($NH_3$)-based etching solutions, tetramethylammonium hydroxide (TMAH)-based etching solutions, ethylene diamine pyrocatechol (EDP)-based etching solutions, and hydroxide based etching solutions such as a potassium hydroxide (KOH) etching solution. Such wet chemical etching processes etch the semiconductor material bounding the sidewalls 26-33 of the deep trench 10 in all crystallographic directions, but at significantly different etching rates normal to different crystal planes or orientations. Therefore, the etch pattern formed by a crystallographic etching process proceeds along the crystal planes of higher etching rate and is eventually terminated by the crystal planes of lower etching rate. The differential in the etching rate is influenced by factors such as solution strength and solution temperature of the etching solution. The etch time is selected to be adequate to produce the targeted change in cross-sectional geometrical shape.

One specific $NH_3$-based etching solution that may be used to sharpen the corners 25 is an aqueous ammonium hydroxide ($NH_4OH$) etching solution having a selected concentration of $NH_3$. For example, the concentration of $NH_3$ in the etching solution may be in the range of one (1) percent by volume to five (5) percent by volume. The etching solution may be formed by combining $NH_3$ in either in liquid or gaseous form and combined with water ($H_2O$), such as deionized water. The temperature of the etching solution may be in a range from 20° C. to 90° C.

In the representative embodiment of the invention in which the substrate 12 is single crystal silicon having a [100] surface normal, sidewalls 26, 28, 30, 32 are aligned with crystallographically equivalent (110) planes and sidewalls 27, 29, 31, 33 are aligned with crystallographically equivalent (100) planes. A crystallographic etching process etch is chosen that has a higher etch rate for (100) crystal planes than for (110) crystal planes. As a result, the etch front for sidewalls 27, 29, 32, 33 advances at a faster rate than the etch front for sidewalls 26, 28, 30, 32. After a given timed etch, the cross-sectional shape of the upper section 22 is modified to eliminate sidewalls 27, 29, 31, 33 and leave only sidewalls 26, 28, 30, 32 that are contained in (110) crystal planes. At the conclusion of the crystallographic etch process, the sidewalls 26, 28, 30, 32 extend continuously along both sections 22, 24 of the deep trench 10. The change in the cross-sectional geometrical shape modifies (i.e., sharpens) the included angles of deep trench 10 from 135° to 90° (i.e., from obtuse angles to right angles) by essentially eliminating the corners 25 associated with (110) planes and the sidewalls 79, 81, 83, 85 aligned with (110) planes due to the differential etch rate that depends upon crystal orientation. Of course, the change in included angle is not so limited and is dependent upon the crystallographic orientation of the trench sidewalls.

In an alternative embodiment, the cross-sectional geometrical shape of the upper section 22 may be modified after the buried plate 36 is formed by exchanging the order of these fabrication stages of the processing method.

Figure 4:
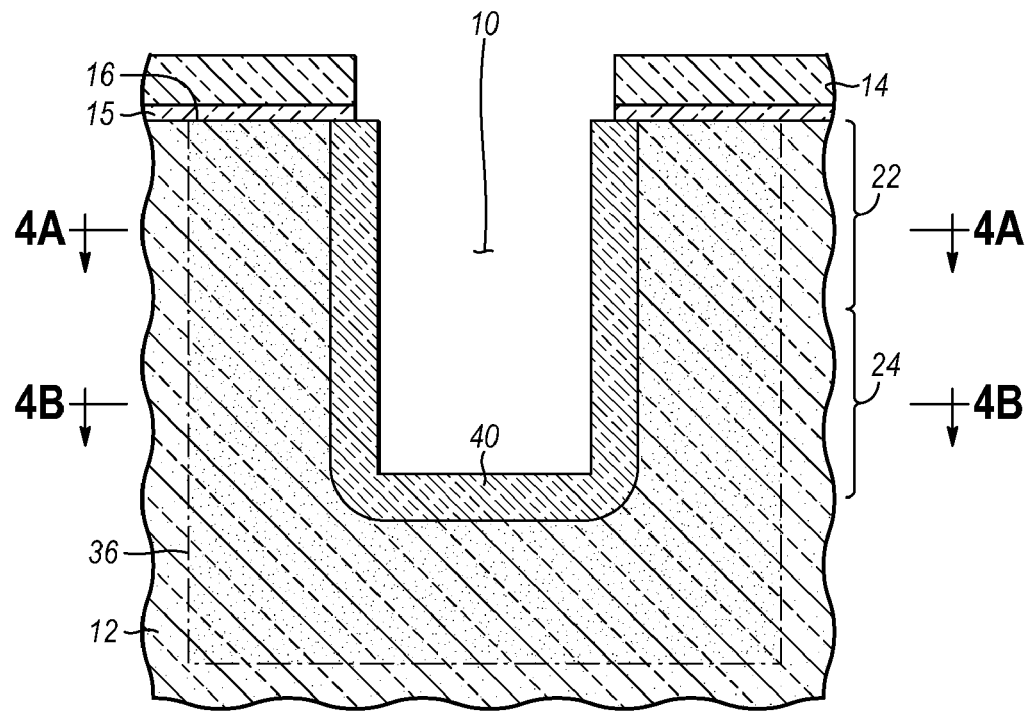
FIGS. 4, 4A, and 4B are diagrammatic cross-sectional views similar to FIGS. 3, 3A, and 3B at a subsequent fabrication stage of the processing method.
Figure 4A:
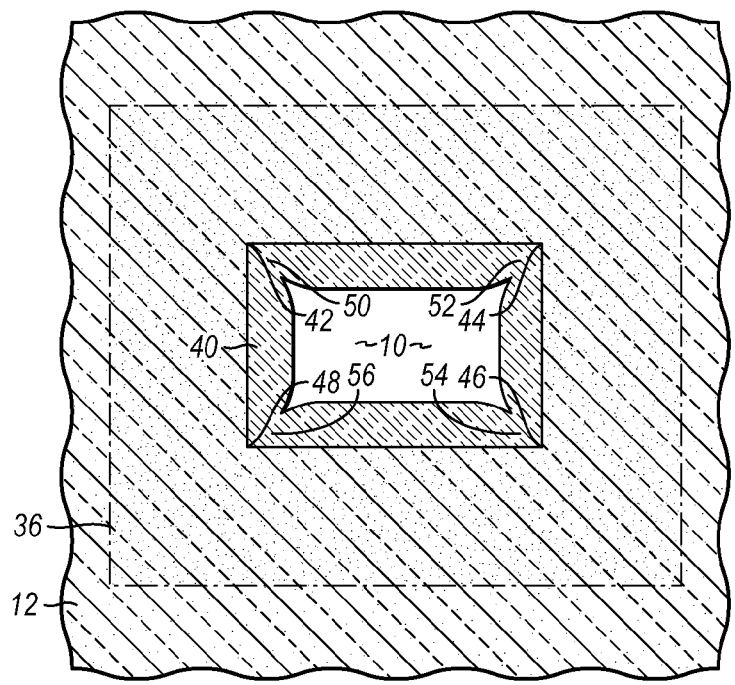
Figure 4B:
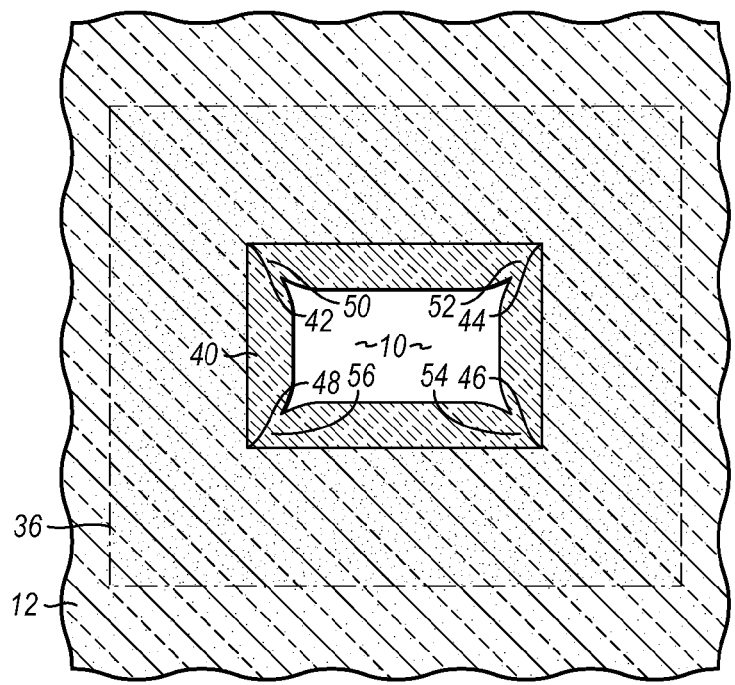

With reference to FIGS. 4, 4A, 4B in which like reference numerals refer to like features in FIGS. 3, 3A, 3B and at a subsequent fabrication stage, a dielectric layer 40 is formed on the sidewalls 26, 28, 30, 32 and the bottom wall 38 of the deep trench 10. In one embodiment, the dielectric layer 40 is composed of $SiO_2$ or silicon oxide of a different stoichiometry grown by wet or dry thermal oxidation of the semiconductor material of substrate 12 that borders the sidewalls 26, 28, 30, 32 and the bottom wall 38 of the deep trench 10. The oxidation rate is slower near the corners 42, 44, 46, 48 between adjacent pairs of sidewalls 26, 28, 30, 32 than on the substantially planar surfaces of the sidewalls 26, 28, 30, 32 between the corners 42, 44, 46, 48. As a result, the dielectric layer 40 is thinner at the corners 42, 44, 46, 48 of deep trench 10 than on the sidewalls 26, 28, 30, 32. In one embodiment, the dielectric layer 40 has a thickness of about 4 nm on the sidewalls 26, 28, 30, 32 and about 3 nm at the corners 42, 44, 46, 48. Other candidate dielectric materials for dielectric layer 40 include, but are not limited to, $Si_3N_4$, a binary nitride-oxide layer stack, or a high-k dielectric (e.g., $HfO_2$, $ZrO_2$) deposited by chemical vapor deposition (CVD) or atomic layer deposition (ALD).

Because of the thinner oxide and/or the higher electrical field, the trench anti-fuse structure 65 (FIGS. 6, 6A, 6B) will blow consistently at these thinned regions 50, 52, 54, 56 proximate to the trench corners 42, 44, 46, 48 by dielectric breakdown to provide the low-resistance, closed state connecting the terminals. As a result, the programming operation of trench anti-fuse structure 65 has a higher level of breakdown uniformity than conventional trench anti-fuse structures with uncorrected, non-sharpened corners 25 (FIG. 1A).

Figure 5:
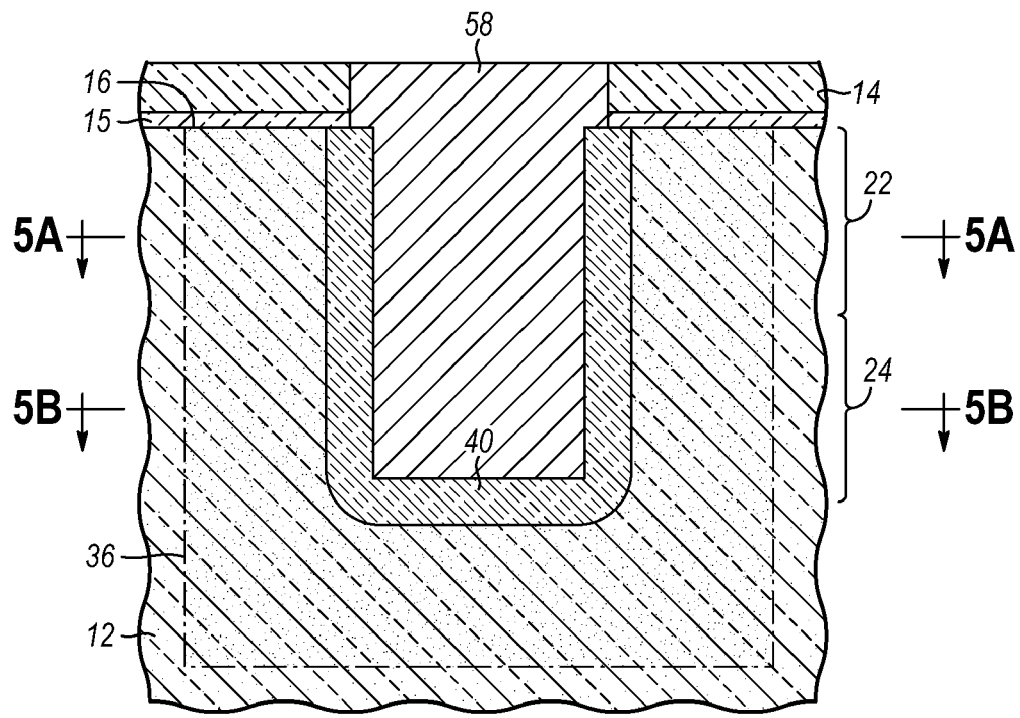
FIGS. 5, 5A, and 5B are diagrammatic cross-sectional views similar to FIGS. 4, 4A, and 4B at a subsequent fabrication stage of the processing method.
Figure 5A:
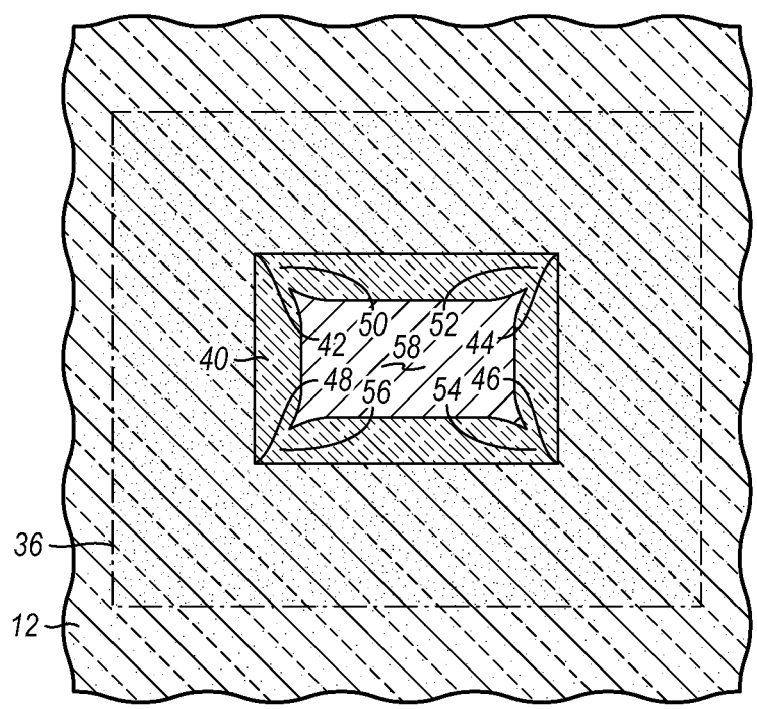
Figure 5B:
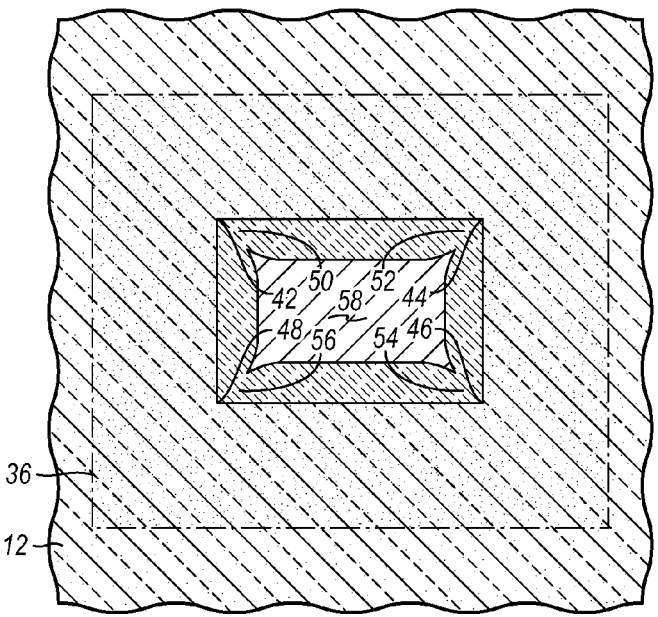

With reference to FIGS. 5, 5A, 5B in which like reference numerals refer to like features in FIGS. 4, 4A, 4B and at a subsequent fabrication stage, another terminal for the trench anti-fuse structure 65 (FIGS. 6, 6A, 6B) in the representative form of a conductor plug 58 is deposited inside the open space within the deep trench 10 that is not already occupied by the dielectric layer 40. The conductor plug 58 may be formed from a conductor, such as doped polycrystalline silicon, (polysilicon), doped silicon germanium, a metal, a conductive metal nitride, or any combination of those materials that can be deposited by conventional deposition processes, including but not limited to CVD and ALD. The conductor plug 58 has a significantly higher electrical conductivity than the dielectric material of dielectric layer 40, which electrically isolates the conductor plug 58 from the buried plate 36.

Because of the improved breakdown uniformity of the dielectric layer 40 and the reduction in the included angle between adjacent pairs of sidewalls 26, 28, 30, 32, a lower programming voltage can be used to program the trench anti-fuse structure 65. For example, a programming voltage of less than five (5) volts, as is conventional, may be used to program the trench anti-fuse structure 65 by permanently and irreversibly breaking down the dielectric material in dielectric layer 40 to connect the conductor plug 58 with the buried plate 36.

Figure 6:
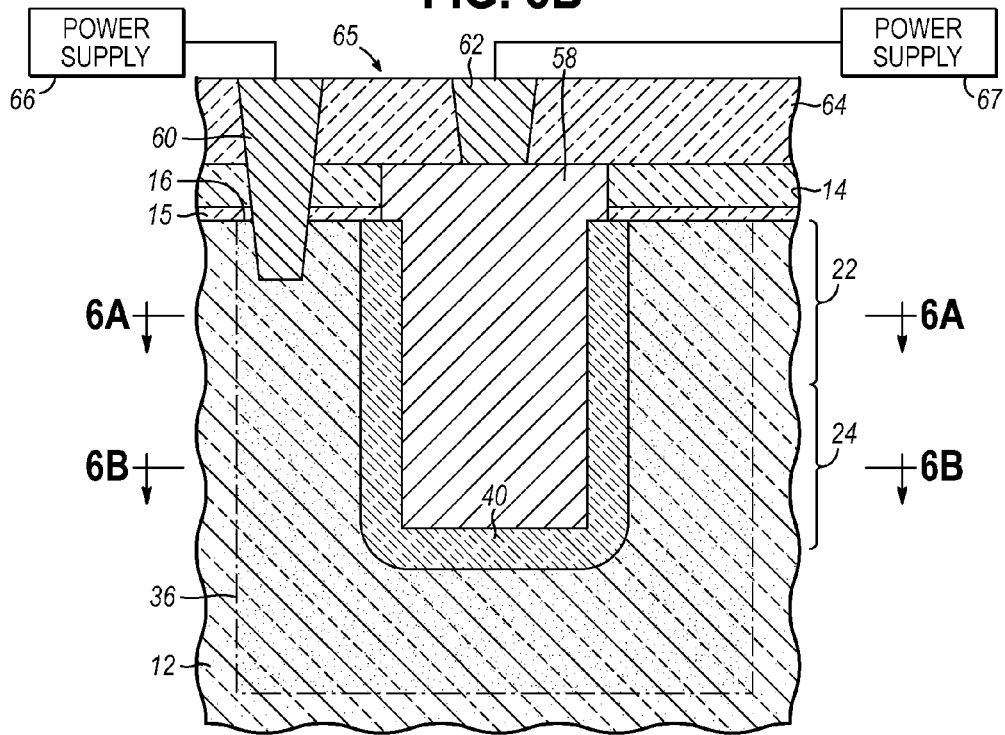
FIGS. 6, 6A, and 6B are diagrammatic cross-sectional views similar to FIGS. 5, 5A, and 5B at a subsequent fabrication stage of the processing method.
Figure 6A:
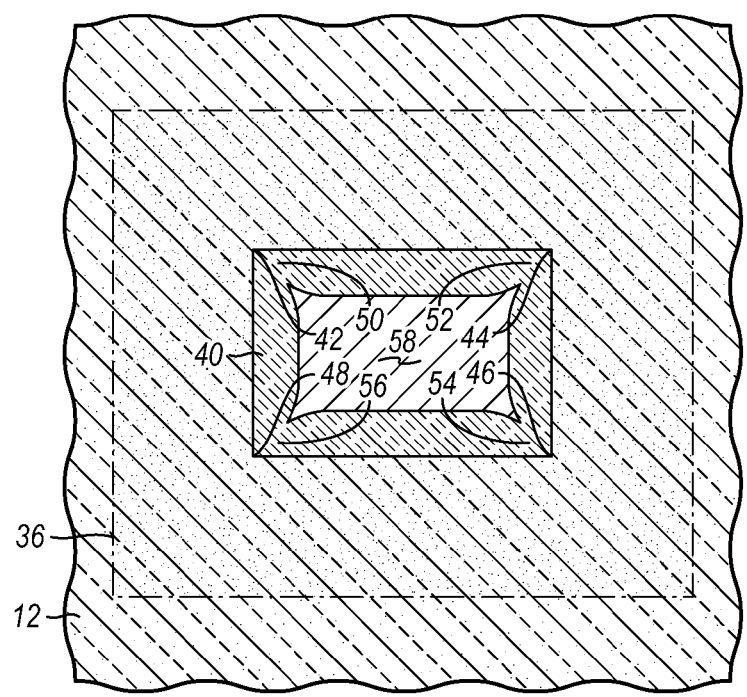
Figure 6B:
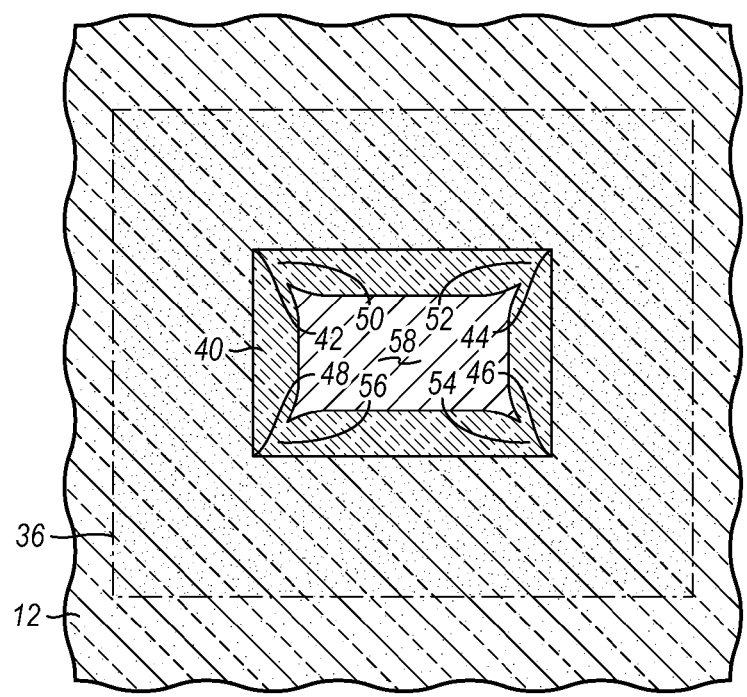

With reference to FIGS. 6, 6A, 6B in which like reference numerals refer to like features in FIGS. 5, 5A, 5B and at a subsequent fabrication stage, the trench anti-fuse structure 65 is completed by forming contacts 60, 62 of a conductor, such as tungsten (W), in a dielectric layer 64 applied on the hardmask layer 14. Contact 60 extends through the dielectric layer 64, as well as the hardmask layer 14 and pad layer 15, and penetrates to a shallow depth into the buried plate 36. Contact 62 extends through the dielectric layer 64 to electrically contact the top surface of the conductor plug 58. Contacts 60, 62 are electrically isolated from each other and vertically contact the buried plate 36 and the conductor plug 58.

Following fabrication, the trench anti-fuse structure 65 is in an unblown or unprogrammed state. The electrical resistance between the conductor plug 58 and the buried plate 36 is approximately a few megaohms or greater, depending primarily on the thickness and composition of the dielectric material contained in dielectric layer 64. To program the trench anti-fuse structure 65, the terminals represented by the buried plate 36 and the conductor plug 58 are electrically biased by a programming potential difference or voltage supplied via contacts 60, 62 from respective power supplies 66, 67. As the electric field increases at the trench corners 42, 44, 46, 48, one or more of the thinned regions 50, 52, 54, 56 of the dielectric layer 64 will experience dielectric breakdown to provide the low-resistance, closed state that electrically connects or shorts the buried plate 36 with the conductor plug 58. The electrical resistance of the dielectric material in one or more thinned regions 50, 52, 54, 56 of dielectric layer 40 that break down is significantly lower than in the unprogrammed state. The dielectric layer 40 has an approximately equal probability of breakdown, when a programming voltage is applied between the terminals represented by the conductor plug 58 and buried plate 36, at the thinned regions 50, 52, 54, 56 at trench corners 42, 44, 46, 48 that is substantially independent of location along the entire height between the bottom wall 38 of the deep trench 10 and the top surface 16 of the substrate 12.

In an alternative embodiment of the invention, a shallow trench may be used instead of the deep trench 10 to form an anti-fuse structure similar to trench anti-fuse structure 65. In particular, shallow trenches may be formed simultaneously for shallow trench isolation regions and for anti-fuse structures. Generally, deep trenches have a high aspect ratio of depth to width greater than 4 to 1 and shallow trenches are characterized by a low aspect ratio less than 4 to 1.

Figure 7:
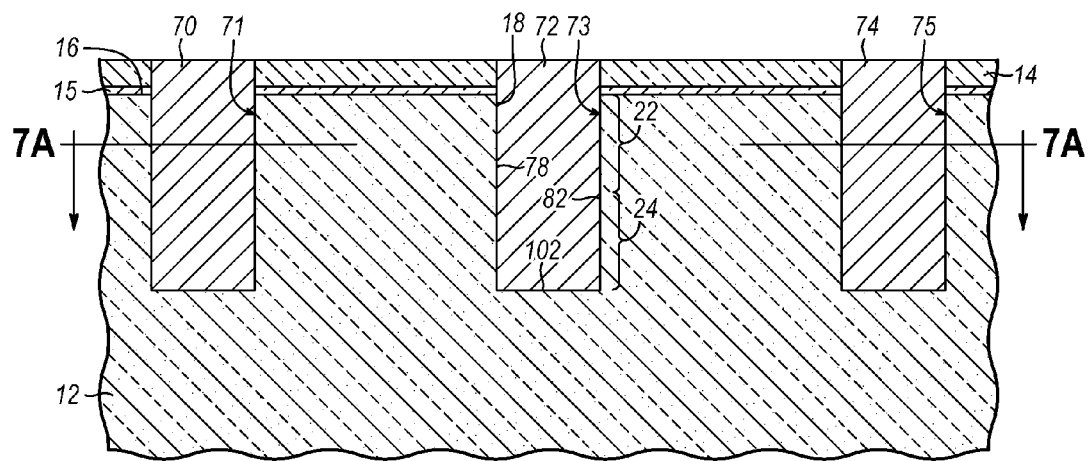
FIG. 7 is a diagrammatic cross-sectional view of a portion of a substrate at an initial fabrication stage of a processing method in accordance with an alternative embodiment of the invention.
Figure 7A:
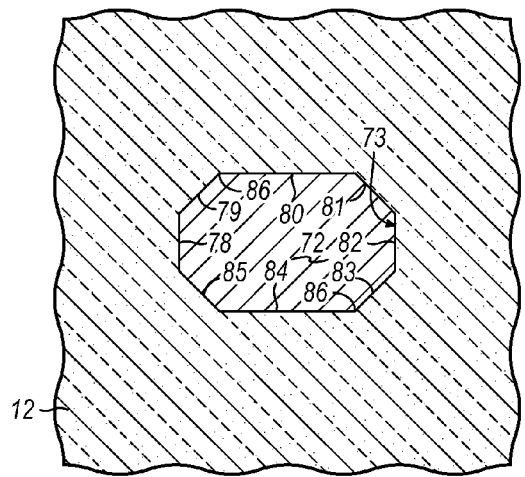
FIG. 7A is a diagrammatic cross-sectional view taken generally along line 7A-7A in FIG. 7.

With reference to FIGS. 7 and 7A in which like reference numerals refer to like features in FIGS. 1, 1A, 1B and in accordance with the alternative embodiment, the substrate 12 is modified to incorporate shallow trench isolation regions, of which shallow trench isolation regions 70, 72, 74 are representative, that extend to shallow depth into the substrate 12. For example, shallow trenches 71, 73, 75 may be defined in the substrate 12 using standard lithography and anisotropic dry etching, and filled with amounts of dielectric material, such as an oxide like densified tetraethylorthosilicate (TEOS) deposited by a CVD process or a high density plasma (HDP) oxide. Planarization removes extraneous dielectric material from the top surface of the hardmask layer 14 and leaves the shallow trench isolation regions 70, 72, 74 embedded in the substrate 12.

Shallow trench 73 has a single cross-sectional geometrical shape that extends along the fully height. Because of the relatively shallow trench depth, multiple cross-sectional geometrical shapes are absent. In one embodiment, the cross-sectional geometrical shape of shallow trench 73 is similar to the upper section 22 (FIG. 1) of the deep trench 10 and has a plurality of sidewalls 78, 79, 80, 81, 82, 83, 84, 85 that intersect at concave corners 86. Shallow trenches 71 and 75 may have various cross-sectional geometrical shapes that are different than the cross-sectional geometrical shape of shallow trench 73 and/or may connect each other so that shallow trench isolation regions 70 and 74 serve as a continuous shallow trench isolation structure.

Figure 8:
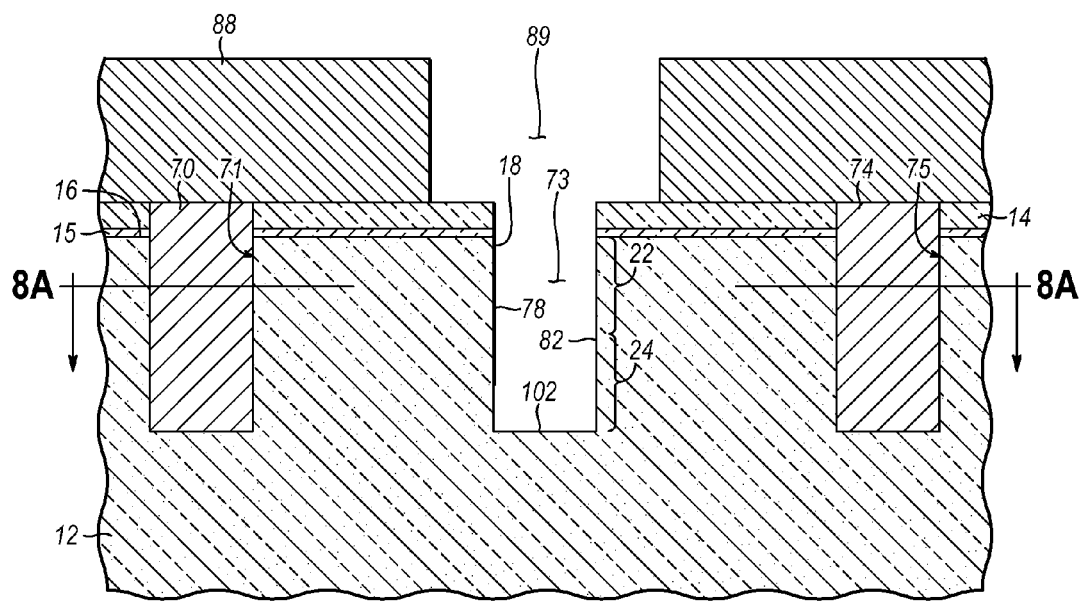
FIGS. 8 and 8A are diagrammatic cross-sectional views similar to FIGS. 7 and 7A taken at a subsequent fabrication stage of the processing method.
Figure 8A:
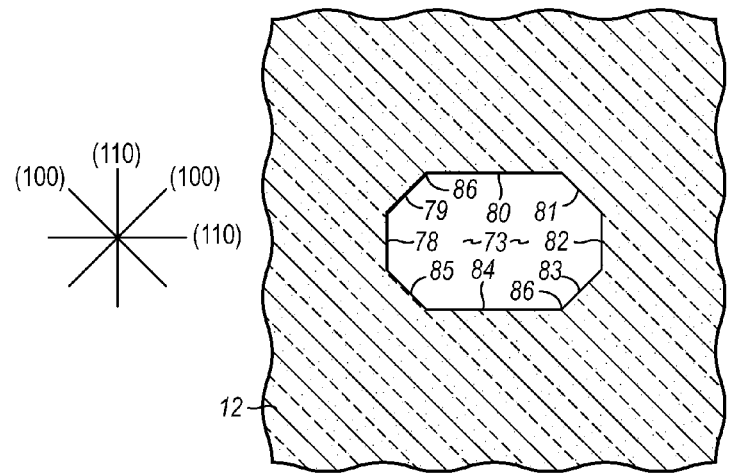

With reference to FIGS. 8 and 8A in which like reference numerals refer to like features in FIGS. 7 and 7A and at a subsequent fabrication stage, a resist layer 88 is applied and patterned in a conventional manner to provide an opening 89 that exposes the shallow trench isolation region 72. Other regions of the resist layer 88 mask the shallow trench isolation regions 70, 74. An etching process, such as an RIE etching process, is applied to remove the dielectric material of the shallow trench isolation region 74 occupying the shallow trench 73. In an alternative embodiment, the dielectric material of the shallow trench isolation region 72 may be only partially removed from the shallow trench 73 so that a thin plug (not shown) of the original dielectric material remains near the bottom wall of the shallow trench 73. The resist layer 88 protects the shallow trench isolation regions 70, 74 during the etching process.

Figure 9:
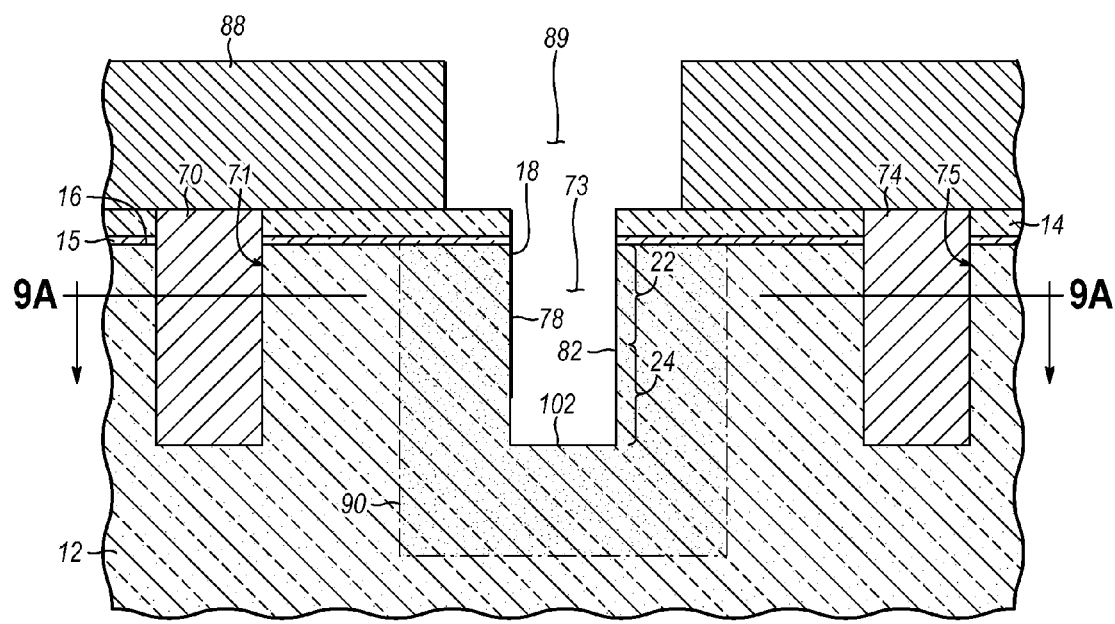
FIGS. 9 and 9A are diagrammatic cross-sectional views similar to FIGS. 8 and 8A at a subsequent fabrication stage of the processing method.
Figure 9A:
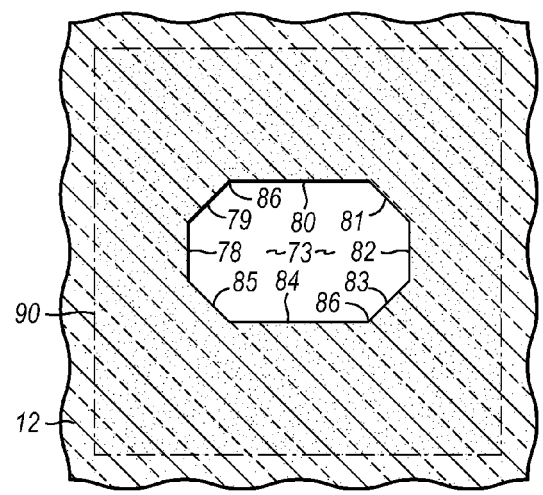

With reference to FIGS. 9 and 9A in which like reference numerals refer to like features in FIGS. 8 and 8A and at a subsequent fabrication stage, a terminal in the form of a buried plate 90 is formed in the semiconductor material surrounding the shallow trench 73. The buried plate 90, which has a construction and properties substantially identical to buried plate 36 (FIGS. 2, 2A, 2B), may be formed in a similar manner to buried plate 36.

Figure 10:
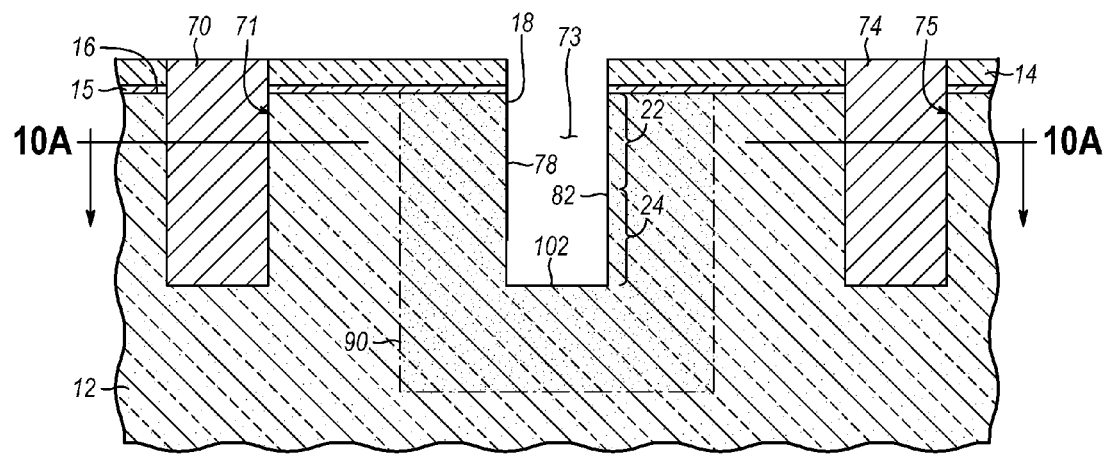
FIGS. 10 and 10A are diagrammatic cross-sectional views similar to FIGS. 9 and 9A at a subsequent fabrication stage of the processing method.
Figure 10A:
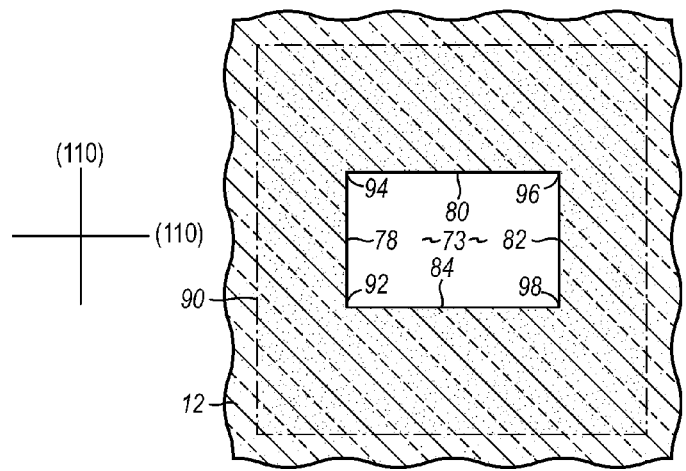

With reference to FIGS. 10 and 10A in which like reference numerals refer to like features in FIGS. 9 and 9A and at a subsequent fabrication stage, the resist layer 88 (FIGS. 9 and 9A) is removed by plasma ashing or with a chemical stripper. As described with regard to FIGS. 3, 3A, 3B, the concave corners 86 of the shallow trench 73 defined at intersecting pairs of sidewalls 78-85 are sharpened with a crystallographic etching process so that sidewalls 78, 80, 82, 84 are continuous along the full height of the shallow trench 73 and sidewalls 79, 81, 83, 85 are eliminated. After sharpening, corners 92, 94, 96, 98 extend along the full height of the shallow trench 73. The change in the cross-sectional geometrical shape modifies (i.e., sharpens) the included angles from 135° to 90° (i.e., right angles) by essentially eliminating the sidewalls 79, 81, 83, 85 due to the differential etch rate that depends upon crystal orientation. The shallow trenches 71 and 73 retain the original cross-sectional geometrical profile imparted the anisotropic RIE process.

Figure 11:
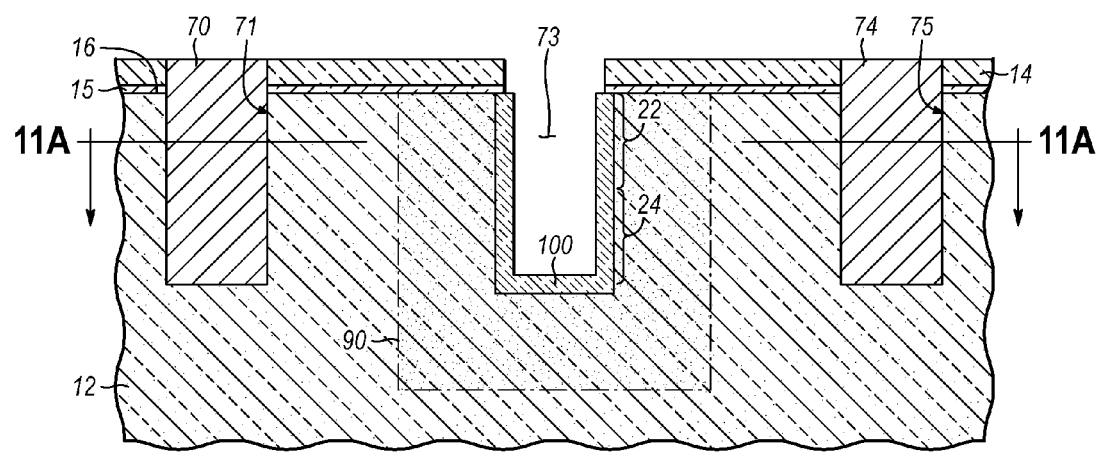
FIGS. 11 and 11A are diagrammatic cross-sectional views similar to FIGS. 10 and 10A at a subsequent fabrication stage of the processing method.
Figure 11A:
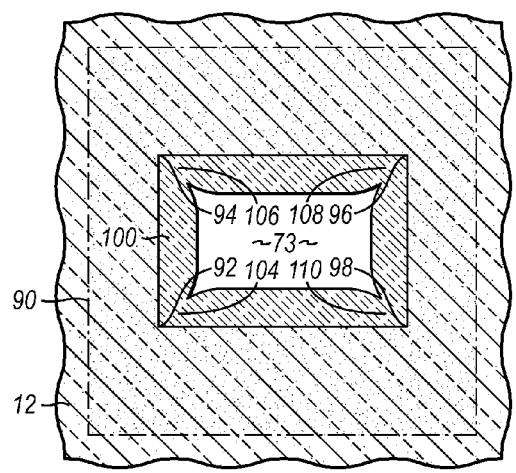

With reference to FIGS. 11 and 11A in which like reference numerals refer to like features in FIGS. 10 and 10A and at a subsequent fabrication stage, a dielectric layer 100, which is similar to dielectric layer 40 (FIGS. 4, 4A, 4B), is formed on the sidewalls 78, 80, 82, 84 and a bottom wall 102 of the shallow trench 73. The dielectric layer 100 is thinner proximate to the corners 92, 94, 96, 98 of shallow trench 73 than on the intervening planar portions of the sidewalls 78, 80, 82, 84. Because of the thinner oxide and/or the higher electrical field, the trench anti-fuse structure 105 (FIGS. 12 and 12A) will blow consistently at these thinned regions 104, 106, 108, 110 at the trench corners 92, 94, 96, 98 by dielectric breakdown to provide the low-resistance, closed state.

As a result, the programming operation of trench anti-fuse structure 105 has a higher degree of breakdown uniformity than conventional trench anti-fuse structures with uncorrected, non-sharpened corners 86 (FIG. 8A). The dielectric layer 100 has an approximately equal probability of breakdown, when a programming voltage is applied between the terminals represented by the conductor plug 114 and buried plate 90, at the thinned regions 104, 106, 108, 110 at trench corners 92, 94, 96, 98 that is independent of location along the entire height between the bottom wall 102 of the shallow trench 73 and the top surface 16 of the substrate 12.

Figure 12:
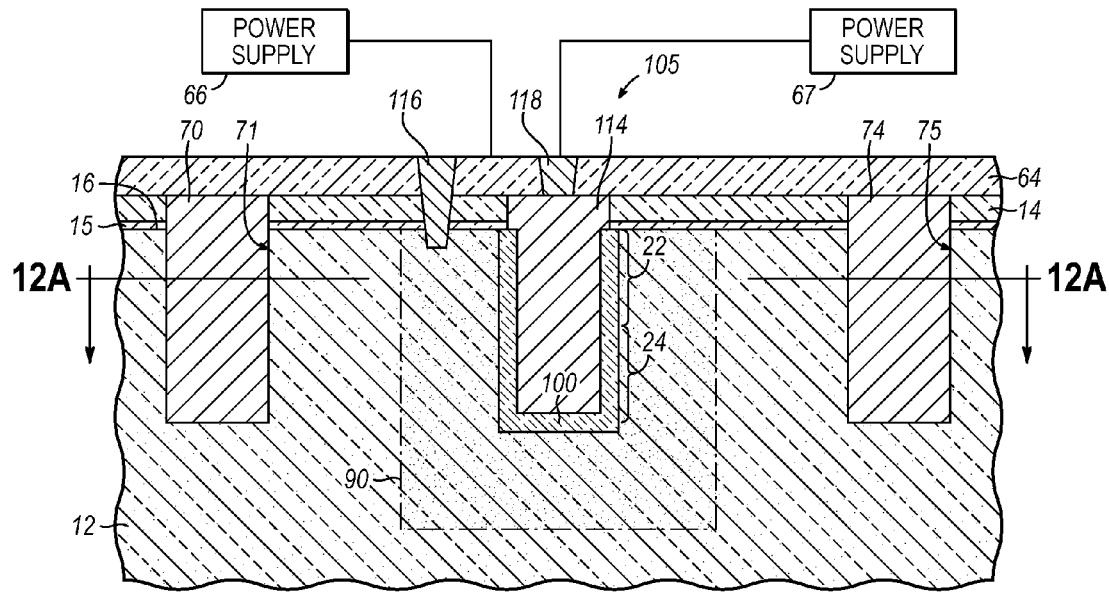
FIGS. 12 and 12A are diagrammatic cross-sectional views similar to FIGS. 11 and 11A at a subsequent fabrication stage of the processing method.
Figure 12A:
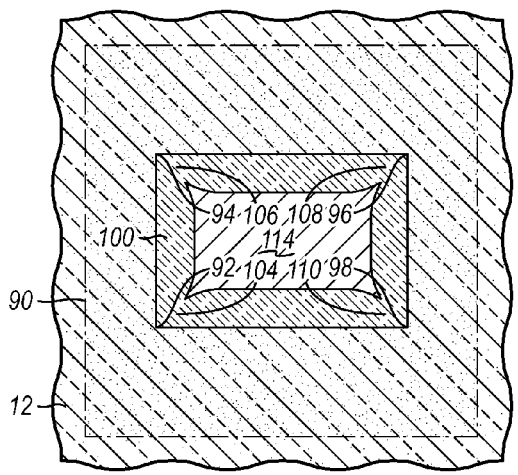

With reference to FIGS. 12 and 12A in which like reference numerals refer to like features in FIGS. 11 and 11A and at a subsequent fabrication stage, another terminal for the trench anti-fuse structure 105 in the representative form of a conductor plug 114, which is similar in construction to conductor plug 58 (FIGS. 5, 5A, 5B) is deposited inside the space inside the shallow trench 73 that is not occupied by the dielectric layer 100. Dielectric layer 100 electrically isolates the conductor plug 114 from the buried plate 90. Contacts 116, 118, which are similar to contacts 60, 62 (FIGS. 6, 6A, 6B), are formed to provide electrical contacts with the buried plate 90 and the conductor plug 114, respectively, so that the trench anti-fuse structure 105 is wired for operation.

Following fabrication, the trench anti-fuse structure 105 is in an unblown or unprogrammed state. To program the trench anti-fuse structure 105, the terminals represented by the buried plate 90 and the conductor plug 114 are electrically biased by a programming potential difference or voltage supplied via contacts 116, 118 from the respective power supplies 66, 67. The dielectric material in the thinned regions 104, 106, 108, 110 of dielectric layer 100 has high electrical resistance when the trench anti-fuse structure 105 is unprogrammed and a significantly lower electrical resistance value when the trench anti-fuse structure 105 is programmed. The lower resistance is provided by breakdown of a portion of the dielectric material of the dielectric layer 100 in one or more of the thinned regions 104, 106, 108, 110. In the lower resistance state, the buried plate 90 and the conductor plug 114 are electrically connected by the broken-down region of dielectric layer 100.

Because of the improved breakdown uniformity of the dielectric layer 100 and the reduction in the included angle between adjacent pairs of sidewalls 78, 80, 82, 84, a lower programming voltage can be used to program anti-fuse structure 105. For example, a programming voltage of less than five (5) volts, as is conventional, may be used to program the trench anti-fuse structure 105 by permanently and irreversibly breaking down the dielectric material in dielectric layer 100 to connect the conductor plug 114 with the buried plate 90.

Figure 13:
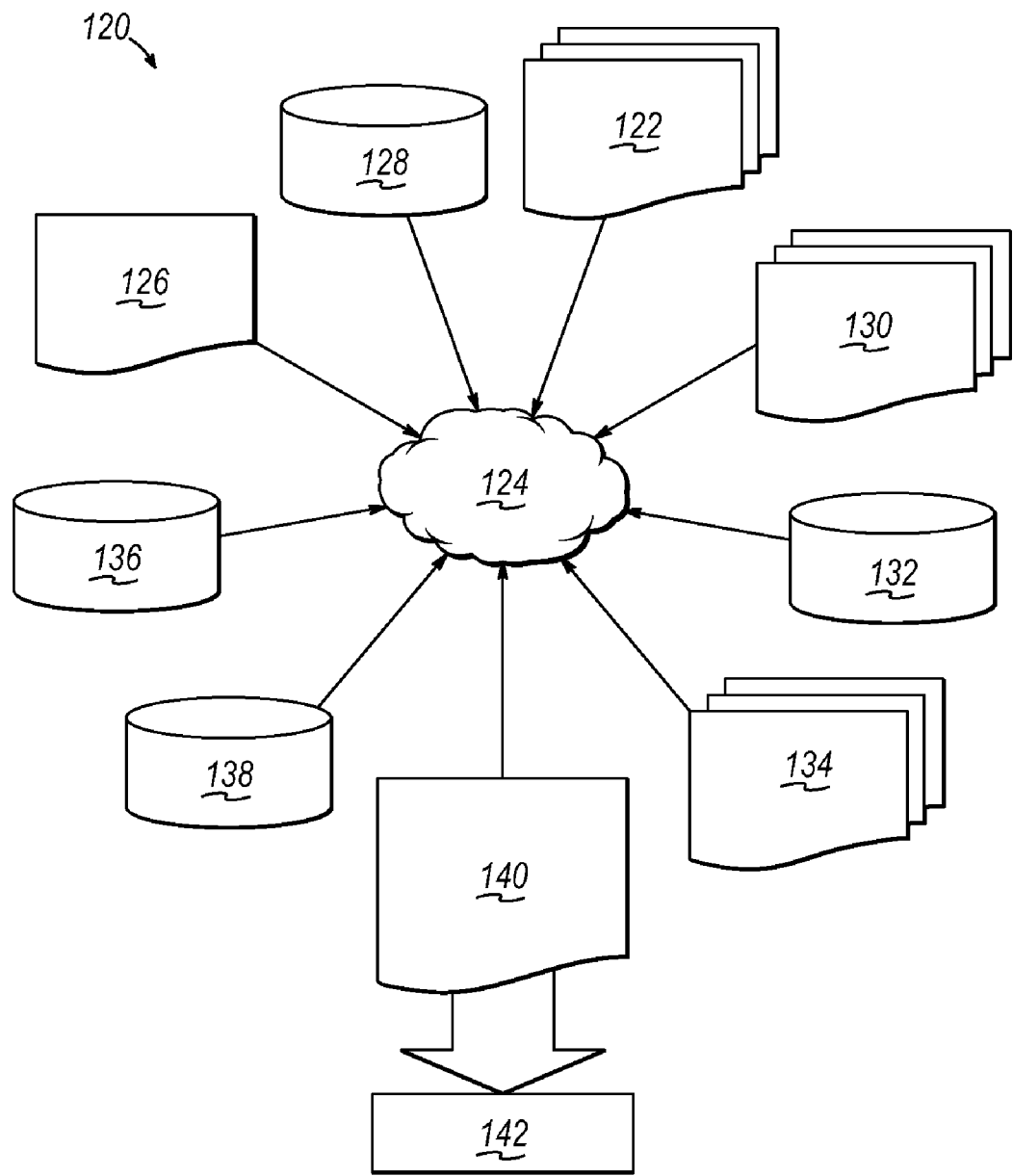
FIG. 13 is a flow diagram of a design process used in semiconductor design, manufacture, and/or test.

FIG. 13 shows a block diagram of an exemplary design flow 120 used for example, in semiconductor IC logic design, simulation, test, layout, and manufacture. Design flow 120 includes processes and mechanisms for processing design structures or devices to generate logically or otherwise functionally equivalent representations of the design structures and/or devices described above and shown in FIGS. 6, 6A, 6B and in FIGS. 12, 12A. The design structures processed and/or generated by design flow 120 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 120 may vary depending on the type of representation being designed. For example, a design flow 120 for building an application specific IC (ASIC) may differ from a design flow 120 for designing a standard component or from a design flow 120 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 122 that is preferably processed by a design process 124. Design structure 122 may be a logical simulation design structure generated and processed by design process 124 to produce a logically equivalent functional representation of a hardware device. Design structure 122 may also or alternatively comprise data and/or program instructions that when processed by design process 124, generate a functional representation of the physical structure of a hardware device. Whether representing functional and/or structural design features, design structure 122 may be generated using electronic computer-aided design (ECAD) such as implemented by a core developer/designer. When encoded on a machine-readable data transmission, gate array, or storage medium, design structure 122 may be accessed and processed by one or more hardware and/or software modules within design process 124 to simulate or otherwise functionally represent an electronic component, circuit, electronic or logic module, apparatus, device, or system such as those shown in FIGS. 6, 6A, 6B and in FIGS. 12, 12A. As such, design structure 122 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 124 preferably employs and incorporates hardware and/or software modules for synthesizing, translating, or otherwise processing a design/simulation functional equivalent of the components, circuits, devices, or logic structures shown in FIGS. 6, 6A, 6B and in FIGS. 12, 12A to generate a netlist 126 which may contain design structures such as design structure 122. Netlist 126 may comprise, for example, compiled or otherwise processed data structures representing a list of wires, discrete components, logic gates, control circuits, I/O devices, models, etc. that describes the connections to other elements and circuits in an integrated circuit design. Netlist 126 may be synthesized using an iterative process in which netlist 126 is resynthesized one or more times depending on design specifications and parameters for the device. As with other design structure types described herein, netlist 126 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 124 may include hardware and software modules for processing a variety of input data structure types including netlist 126. Such data structure types may reside, for example, within library elements 128 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 130, characterization data 132, verification data 134, design rules 136, and test data files 138 which may include input test patterns, output test results, and other testing information. Design process 124 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 124 without deviating from the scope and spirit of the invention. Design process 124 may also include modules for performing standard circuit design processes such as timing analysis, verification, design rule checking, place and route operations, etc.

Design process 124 employs and incorporates logic and physical design tools such as HDL compilers and simulation model build tools to process design structure 122 together with some or all of the depicted supporting data structures along with any additional mechanical design or data (if applicable), to generate a second design structure 140. Design structure 140 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 122, design structure 140 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 6, 6A, 6B and in FIGS. 12, 12A. In one embodiment, design structure 140 may comprise a compiled, executable HDL simulation model that functionally simulates the devices shown in FIGS. 6, 6A, 6B and in FIGS. 12, 12A.

Design structure 140 may also employ a data format used for the exchange of layout data of integrated circuits and/or symbolic data format (e.g., information stored in a GDSII (GDS2), GL1, OASIS, map files, or any other suitable format for storing such design data structures). Design structure 140 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 6, 6A, 6B and in FIGS. 12, 12A. Design structure 140 may then proceed to a stage 142 where, for example, design structure 140: proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "composed of", "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "attached", "connected", or "coupled" to another element, it can be directly connected or coupled to the other element or intervening elements may be present. In contrast, when an element is described as being "directly attached", "directly connected", or "directly coupled" to another element, there are no intervening elements present.

The fabrication of the structures herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An anti-fuse structure formed using a substrate composed of a semiconductor material and having a top surface, the anti-fuse structure comprising:
a trench including a bottom wall and a plurality of sidewalls that extend from the top surface of the substrate to the bottom wall, the sidewalls of the trench arranged with a cross-sectional geometrical shape that is independent of position between the bottom wall of the trench and the top surface of the substrate;
a doped region in the semiconductor material of the substrate proximate to the sidewalls of the trench;
a conductive plug in the trench; and
a dielectric layer on the sidewalls of the trench, the dielectric layer disposed between the conductive plug and the doped region,
wherein the dielectric layer is configured so that a programming voltage applied between the doped region and the conductive plug causes an irreversible breakdown of the dielectric layer within a region of the trench to electrically connect the doped region irreversibly with the conductive plug.

2. The anti-fuse structure of claim 1 wherein each adjacent pair of the sidewalls intersects at a concave corner of the trench, and the dielectric layer is thinner proximate to each corner to provide the region of the dielectric layer prone to the irreversible breakdown.

3. The anti-fuse structure of claim 1 wherein the sidewalls of the trench are all aligned with crystallographically equivalent crystal planes of the semiconductor material of the substrate.

4. The anti-fuse structure of claim 3 wherein the semiconductor material of the substrate is single crystal silicon, the crystallographically equivalent crystal planes are (110) crystal planes of the single crystal silicon, and adjacent pairs of the (110) crystal planes intersect at an included angle of about 90°.

5. The anti-fuse structure of claim 1 wherein the cross-sectional geometrical shape is substantially rectangular with an included angle of approximately 90° between adjacent pairs of sidewalls.

6. The anti-fuse structure of claim 1 wherein the trench includes a plurality of corners, adjacent pairs of the sidewalls intersect at one of the corners, the dielectric layer is composed of silicon dioxide, and the silicon dioxide is thinner on each of the sidewalls proximate to each corner than on other areas of the sidewalls to provide the region of the dielectric layer prone to the irreversible breakdown.

7. The anti-fuse structure of claim 1 wherein the region of the trench that experiences the irreversible breakdown of the dielectric layer, when the programming voltage is applied between the doped region and the conductive plug, is independent of position between the bottom wall of the trench and the top surface of the substrate.

8. The anti-fuse structure of claim 1 wherein the dielectric layer is configured such that the programming voltage that causes the irreversible breakdown of the dielectric layer is less than five volts.

9. An anti-fuse structure formed using a substrate composed of a semiconductor material and having a top surface, the anti-fuse structure comprising:
a first shallow trench including a bottom wall and a plurality of sidewalls that extend from the top surface of the substrate to the bottom wall, the sidewalls of the first shallow trench are arranged with a first cross-sectional geometrical shape;
a second shallow trench in the substrate adjacent to the first shallow trench and filled with a dielectric material, the second shallow trench having a plurality of sidewalls with a second cross-sectional geometrical shape different than the first cross-sectional geometrical shape of the first shallow trench;
a doped region in the semiconductor material of the substrate proximate to the sidewalls of the first shallow trench;
a conductive plug in the first shallow trench; and
a dielectric layer on the sidewalls of the first shallow trench, the dielectric layer disposed between the conductive plug and the doped region,
wherein the dielectric layer is configured so that a programming voltage applied between the doped region and the conductive plug causes an irreversible breakdown of the dielectric layer within a region of the first shallow trench to electrically connect the doped region irreversibly with the conductive plug.

10. The anti-fuse structure of claim 9 wherein the first cross-sectional geometrical shape is independent of position between the bottom wall of the first shallow trench and the top surface of the substrate.

11. The anti-fuse structure of claim 9 wherein the sidewalls of the second shallow trench are aligned with at least first and second sets of crystallographically equivalent crystal planes of the semiconductor material of the substrate, and the sidewalls of the first shallow trench are aligned with only the first set of crystallographically equivalent crystal planes of the semiconductor material of the substrate.

12. The anti-fuse structure of claim 11 wherein the semiconductor material of the substrate is single crystal silicon, the first set of crystallographically equivalent crystal planes are (110) crystal planes of the single crystal silicon, and the second set of crystallographically equivalent crystal planes are (100) planes of the single crystal silicon.

13. The anti-fuse structure of claim 9 wherein the first cross-sectional geometrical shape is substantially rectangular with four corners each having an included angle of about 90°, and the second cross-sectional geometrical shape is substantially octagonal with eight corners each having an included angle of about 135°.

14. The anti-fuse structure of claim 9 wherein each adjacent pair of the sidewalls intersects at a concave corner of the first shallow trench, and the dielectric layer is thinner proximate to each corner to provide the region of the dielectric layer prone to the irreversible breakdown.

15. The anti-fuse structure of claim 9 wherein the sidewalls of the first shallow trench are all aligned with crystallographically equivalent crystal planes of the semiconductor material of the substrate.

16. The anti-fuse structure of claim 9 further comprising:
a dielectric plug in the first shallow trench between the conductive plug and the bottom wall.

17. The anti-fuse structure of claim 9 wherein the first cross-sectional geometrical shape is substantially rectangular with an included angle of approximately 90° between adjacent pairs of sidewalls.

18. The anti-fuse structure of claim 9 wherein the first shallow trench includes a plurality of corners, adjacent pairs of the sidewalls intersect at one of the corners, the dielectric layer is composed of silicon dioxide, and the silicon dioxide is thinner on each of the sidewalls proximate to each corner than on other areas of the sidewalls to provide the region of the dielectric layer prone to the irreversible breakdown.

19. The anti-fuse structure of claim 9 wherein the dielectric layer is configured such that the programming voltage that causes the irreversible breakdown of the dielectric layer is less than five volts, and the region of the first shallow trench that experiences the irreversible breakdown of the dielectric layer, when the programming voltage of less than five volts is applied between the doped region and the conductive plug, is independent of position between the bottom wall of the first shallow trench and the top surface of the substrate.

20. A method of fabricating an anti-fuse structure using a substrate composed of a semiconductor material, the method comprising:
　forming a trench in the substrate that has a plurality of sidewalls arranged with a first cross-sectional geometrical shape;
　doping the semiconductor material of the substrate proximate to the sidewalls of the trench to define a first conductive terminal of the anti-fuse structure;
　modifying the sidewalls of the trench to change the first cross-sectional geometrical shape to a second cross-sectional geometrical shape;
　forming a dielectric layer of non-uniform thickness on the sidewalls of the trench; and
　forming a conductive plug in the trench to define a second conductive terminal of the anti-fuse structure that is separated from the first conductive terminal by the dielectric layer.

21. A method of programming an anti-fuse structure formed in a trench having a plurality of sidewalls extending into a substrate composed of a semiconductor material, the anti-fuse structure including a dielectric layer on the sidewalls, a first terminal in the semiconductor material of the substrate bordering the trench, and a second terminal inside the trench and separated from the first terminal by the dielectric layer, the method comprising:
　in response to applying a programming voltage between the first terminal and the second terminal, causing the dielectric layer to irreversibly breakdown with an approximately equal probability along substantially an entire height of the trench and, thereby, to electrically couple the first terminal permanently with the second terminal.

* * * * *